United States Patent [19]

Berger

[11] 4,051,163

[45] Sept. 27, 1977

[54] POLYIMIDE CONTAINING SILICONES

[76] Inventor: Abe Berger, 1504 Barclay Place, Schenectady, N.Y. 12309

[21] Appl. No.: 779,072

[22] Filed: Mar. 18, 1977

Related U.S. Application Data

[62] Division of Ser. No. 597,971, July 21, 1975, Pat. No. 4,030,948.

[51] Int. Cl.² .............................................. C07F 7/10
[52] U.S. Cl. ............................ 260/448.2 N; 260/404.5
[58] Field of Search ................................ 260/448.2 N

[56] References Cited

U.S. PATENT DOCUMENTS

| 3,624,010 | 11/1971 | Holdstock | 260/448.2 N X |
|---|---|---|---|
| 3,755,254 | 8/1976 | Zeuner | 260/448.2 N X |
| 3,884,947 | 5/1975 | Badin et al. | 260/448.2 N X |
| 3,903,052 | 9/1975 | Wagner et al. | 260/448.2 N X |
| 3,966,531 | 6/1976 | Bargain | 260/448.2 N X |

*Primary Examiner*—Paul F. Shaver

[57] ABSTRACT

A copolymer which is the reaction product of a tetracarboxylic acid dianhydride, and organic diamine and a di(aminoalkyl) poly siloxane where the di(aminoalkyl) poly siloxane constitutes 18–45 mole percent of the total amine requirement of the polymer and is applicable as a conformal protective coating for electronic devices.

5 Claims, 5 Drawing Figures

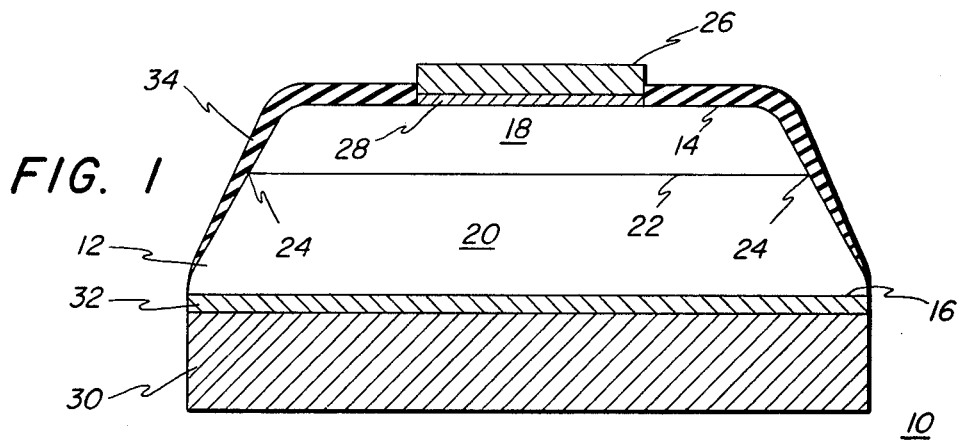
FIG. 1
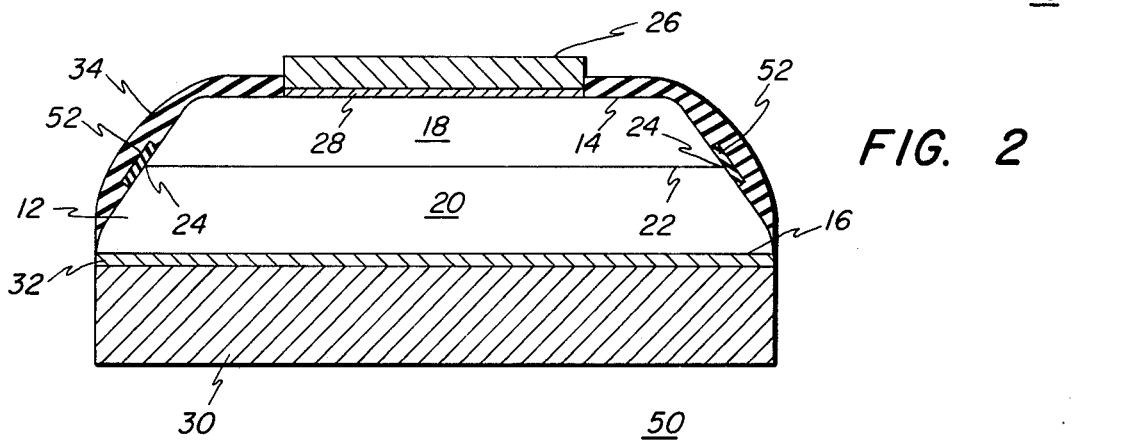
FIG. 2
FIG. 3
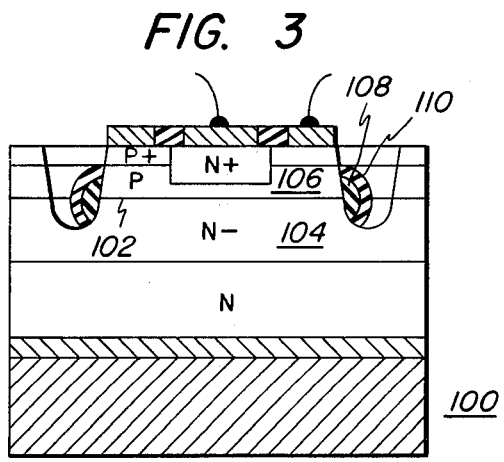
FIG. 4
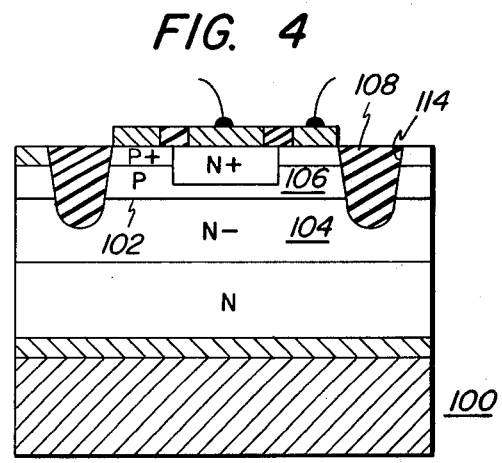
FIG. 5
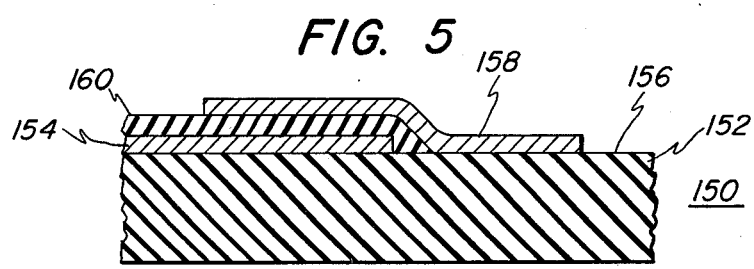

POLYIMIDE CONTAINING SILICONES

This is a division of application Ser. No. 597,971, filed July 21, 1975, now U.S. Pat. No. 4,030,948.

BACKGROUND OF THE INVENTION

1. Field of the Invention

This invention relates to conformal protective coatings for electronic devices and, in particular, to a copolymer which is a reaction product of a tetracarboxylic acid dianhydride, a diamine and a di(aminoalkyl)-siloxane.

2. Description of the Prior Art

A semiconductor device which exhibits an undesirable resistance to reverse biasing breakdown often has been found to have detrimental leakage currents existing on selected surface areas during operation of the device. The leakage currents arise from the mobility of ions which are formed from ions of adsorbed molecules.

Heretofore, prior art methods to correct such deficiencies provided a means for protecting selected surface areas of electrical devices, in particular, exposed end portions of P-N junctions of a semiconductor device, with an electrically insulating material such, for example, as silicon oxide, silicon nitride, aluminum nitride and the like. Such materials are provided as a thin layer of a coating material on the selected surface area and have virtually no resistance to mechanical abrasion and require relatively expensive processing techniques and equipment. In many instances a second, and thicker, layer of coating material is disposed on the layer of electrically insulating material to provide a suitable abrasive protective means therefor. Silicone varnishes, rubbers, resins and the like are employed as the overcoating material but often lack suitable physical characteristics. Often these silicone materials require two components which must be mixed together, a catalyst to aid in curing, extensive curing times up to 24 hours and more, and chelating agents admixed therein.

Improvements have been made such, for example, as provided by Shaw in his U.S. Pat. No. 3,615,913. However, the improved material lacks desirable adhesion and electrical properties required for some electronic device applications.

In series of U.S. patents including U.S. Pat. Nos. 325,450 and 3,740,305, Holub teaches a Ter-Polymer System consisting of a Diamino Siloxane, an organic diamine and a Tetracarboxylic Acid Dianhydride are disclosed. In these patents the combinations of the Diamino Siloxanes with the organic diamine varied between the two extremes in conjunction with molar quantities of Tetracarboxylic Acid Dianhydride. It is not apparent from the teachings of these patents that any specific combination of components would be more effective coating materials over and beyond their direct relationship to either the 100% polyimide or 100% polysiloxane terminal component.

It is an object of this invention to provide a new and improved conformal coating suitable for use on electronic components.

Another object of this invention is to provide a polyimide-siloxane copolymer material for use as a conformal coating on electronic components wherein the copolymer contains from 18 to 45 mole percent of the silicone diamine.

Another object of this invention is to provide a copolymer which is a reaction product of a tetracarboxylic acid dianhydride, a diamine and a di(aminoalkyl) siloxane.

Other objects of this invention will, in part, be obvious and will, in part, appear hereinafter.

SUMMARY OF THE INVENTION

In accordance with the teachings of this invention, there is provided a reaction product of a tetracarboxylic acid dianhydride, a diamine and a di(aminoalkyl) polysiloxane wherein the polysiloxane diamine constitutes from 18 to 45 mole percent of the total diamines in the copolymer. The copolymer has recurring structural units of a block copolymer of the formulas:

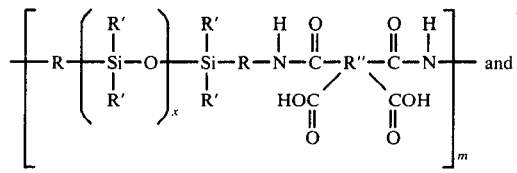 and

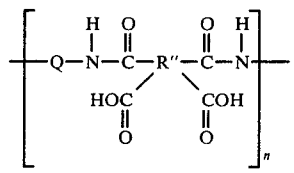

and a random polymer of the formula:

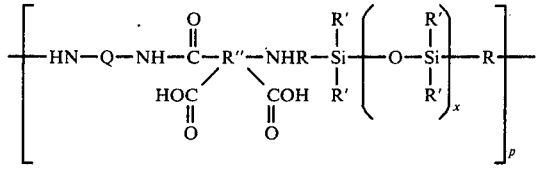

wherein:

R is a divalent hydrocarbon radical:

R' is a monovalent hydrocarbon radical wherein each R' may be the same radical or a different radical from the others;

R" is a tetravalent organic radical;

Q is a divalent organic radical which is a residue of an organic diamine;

$x$ is an integer having a value of from 1 to 10;

$m$ is an integer greater than 1 and $n$ is an integer greater than 1.

$p$ is an integer greater or equal to 0.

the ratios of the recurring units designated by $m$, $n$, and $p$ are such that the quantity of silicone diamine in the total polymer constitutes from 18 to 45 mole percent of the total diamines in the polymer. The material is particularly suitable for the application of conformal coatings thereto to improved the operating characteristics of semiconductor and other electrical devices. The copolymer is a suitable conformable protective and dielectric coating for electronic devices such, for example, as semiconductor devices having at least one P-N junction exposed in a surface area thereof, thick and thin films circuits, printed circuits, faces of cathode ray vacuum tubes, high voltage leads and connections to cathode ray vacuum tubes and the like.

DESCRIPTION OF THE DRAWINGS

FIGS. 1 through 5 are views, in cross-section of electronic devices made in accordance with the teachings of the invention.

DESCRIPTION OF THE INVENTION

Referring now to FIG. 1, there is shown a semiconductor element 10 embodying any one of the novel conformal coating materials of this invention. The element 10 is comprised of a body 12 of single crystal semiconductor material. A suitable semiconductor material for comprising the body 12 may be silicon, silicon carbide, germanium, gallium arsenide, a compound of a Group III element and a Group V element of the Periodic Table or a compound of a Group II element and a Group VI element of the Periodic Table. In order to describe the invention more fully, and for purposes of illustration only, the body 12 is said to be comprised of silicon semiconductor material.

The body 12 is prepared by suitable means, such, for example, as by polishing and lapping to parallelism two major opposed surfaces 14 and 16. The body 12 has two, or more, regions 18 and 20 of alternate and opposite type conductivity. A P-N junction 22 is formed by the contiguous surfaces or each abutting pair of regions of opposite type conductivity. End portions 24 of the P-N junction 22 are exposed in the surface area of the body 12.

A first electrical contact 26 is affixed to, and is in an electrically conductive relationship with the region 18 by a layer 28 of a suitable electrically conductive solder material. A second electrically conductive contact 30 is affixed to the bottom surface 16 of the body 12 by a layer 32 of a suitable electrically conductive solder material. The electrical contacts 26 and 30 provide means for electrically connecting the element 10 into electrical circuitry. When required, the contacts 26 and 30 should exhibit good thermal conductivity properties as well in order to dissipate any heat generated in the body 12 particularly in high voltage, high ampera power devices.

One or more layers 34, as required, of an electrically insulating coating is disposed on at least selected surface area 36 of the body 12 wherein the end portions 24 of P-N junctions 22 are exposed thereat. Preferably, it is desirable to apply the material layer 34 to all exposed surface areas of the body 12. The material of the layer 34 comprises one of the novel conformal coating materials to be described heretoafter.

A conformal protective coating material suitable for use with electric devices must have several desirable physical characteristics. The material must be one which can easily be applied and cured in place. The material must not degrade, but should preferably enhance, the electrical characteristics of the device to which it is applied. The material should adhere very tenaciously to the surface to which it is applied to prevent migration of ions on the surface of the device, particularly when employed with semiconductor devices, and should not release any materials during a curing cycle which are deleterious to the operating characteristics of the device. The coating should be impermeable to moisture and exhibit good abrasion resistance when cured to protect the surfaces to which the coating is applied.

The material should also be capable of being applied in multiple layers to provide a thick coating when required. Therefore, the material must be able to bond well to itself. Should the electronic device be employed in circuitry where corona is a problem, the material must be able to exhibit good corona resistance when cured.

When a material is not capable of inherently exhibiting the above desired characteristics, it must be capable of being modified to achieve the desired end result. Often times stray alkali and heavy metal ions cause undesirable degradation of electrical properties of semiconductor devices. Therefore, the material of the coating must be capable of being modified with chelating materials admixed therewith or chemically bonded thereto. Ease of application to the surface to be protected and reasonably short curing times must still be retained. This is particularly true when the coating material is employed in commercial manufacturing of mass produced electronic devices.

Although the coating material when cured may be opaque, it is more desirable to have the material highly translucent. Such a material, if retaining the other desirable characteristics, would be invaluable for photovoltaic devices. Particularly, it would be desirable to bond a light emitting diode to the surface of another semiconductor device and be capable of turning the device "on" and "off" in response to the operation of the light emitting diode.

Normally the presence of alkali metal contaminants present either on the surface of devices to be coated, or in the coating materials, creates surface current leakage in the devices that limits their useful operation. To circumvent these difficulties, chelating agents such as alizirin, catechol and the like are mechanically admixed with the coating materials before being applied to, and cured on the device surface. However nonuniformity of mixtures result in hazy films, loss of adhesion, etc., making alternate treatments highly desirable for prevention of surface leakage of devices.

I have discovered that silicone containing polyimide compositions wherein the silicone diamine constitutes from 18 to 45 mole percent of the total amine present therein. Preferably from approximately 28 to about 32 mole percent of the total amine in the material product produces coatings which upon curing on the surface of the semiconductor device results in very low leakage current so that additional additives are not required. Furthermore, if the silicone diamine molar ratios fall outside the range of from 18 to 45 mole percent leakage currents increase considerably so that additives once again become a necessity. The resulting leakages are still unacceptable even when such additives are used.

The beneficial effect of low leakage current within the scope of my invention is achieved without loss of other desirable properties such, for example, as adhesion, anticorona properties, high temperature properties and the like of the resulting coating material. Unexpectedly, the narrow range of silicone diamine compositions of this invention achieve such benefical effects.

It is not obvious to those skilled in the art that such a beneficial effect would be obtained by the use of the narrow ranges of silicone compositions described above. Other beneficial results derived from the use of these polymer compositions are as follows: sharp breakdown voltage (approaching theoretical performance of devices) increase adhesion to a wide variety of substrates, extremely high temperature performance outstanding barrier properties to moisture and other gases, unusually high corona resistance, strong coherent films resistant to scratching and marring and the like.

I have discovered that the above described desirable characteristics are achieved by the reaction product of a tetracarboxylic acid dianhydride, a diamine and a di(aminoalkyl) siloxane. The reaction product is a copolymer which has, depending on the modes of mixtures employed, the recurring structural units of a block copolymer of the formulas:

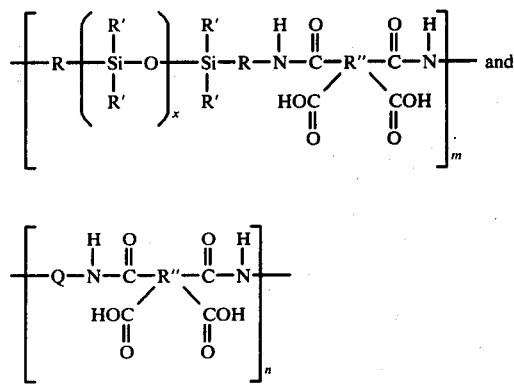

and a random polymer of the formula:

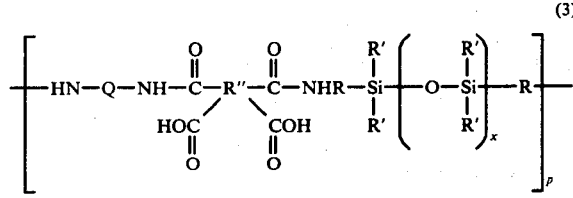

wherein:
R is a divalent hydrocarbon radical; R' is a monovalent hydrocarbon radical wherein each R' may be the same radical or a different radical from the others;
R" is a tetravalent organic radical;
Q is a divalent organic radical which is a residue of an organic diamine
$x$ is an integer having a value of from 1 to 10;
$m$ is an integer greater than 1, and
$n$ is an integer greater than 1.
$p$ is an integer greater than or equal to 0.

The recurring units designated by $m$, $n$, and $p$ are such that the quantity of silicone diamine in the total polymer constitutes from 18 to 45 mole percent of the total diamines the polymer.

The copolymers of the invention are prepared by reacting a mixture of chemical ingredients which is composed of a di(aminoalkyl)polysiloxane of the general formula:

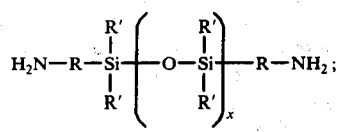

a diamino compound having the general formula:

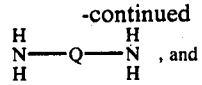

a tetracarboxylic acid dianhydride having the formula:

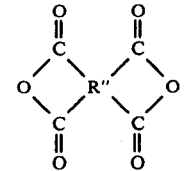

wherein R, R', R", Q and $x$ have the same meanings as described heretofore.

The di(aminoalkyl) polysiloxanes of formula (4) which may be used in the practice of the present invention are limited in that when $x$ is 10 or more they lose their adhesive properties and, consequently, $x$ preferably equals 1–9. The following formulas are descriptive of those di(aminoalkyl) polysiloxane compounds which may be included in the reactive ingredients to make the new copolymer:

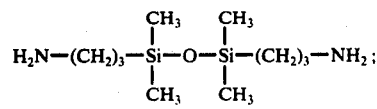

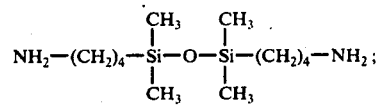

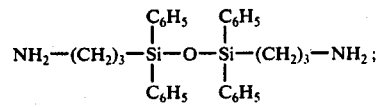

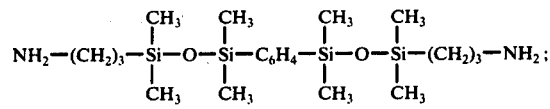

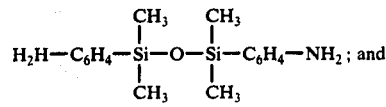

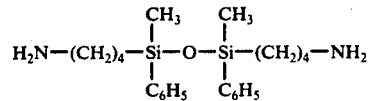

other suitable di(aminoalkyl) siloxane compounds may also be included as one of the reaction ingredients.

Diamines of formular (5) are known in the prior art and many of them are commercially available. Suitable diamines for use as one of the reaction mixture are as follows:

m-phenylenediamine;
p-phenylenediamine;

4,4'-diaminodiphenylpropane;
4,4'-diaminodiphenylmethane;
benzidine;
4,4'-diaminodiphenyl sulfide;
4,4'-diaminodiphenyl sulfone;
4,4'-diaminodiphenyl ether;
1,5-diaminonaphthalene;
3,3'-dimethylbenzidine;
3,3'-dimethoxybenzidine;
2,4-bis(β-amino-t-butyl)toluene;
bis(p-β-amino-t-butylphenyl)ether;
bis(p-β-methyl-o-aminopentyl)benzene;
1,3-diamino-4-isopropylbenzene;
1,2-bis(3-aminopropoxy)ethane;
m-xylylenediamine;
p-xylylenediamine;
bis(4-aminocyclohexyl)methane;
decamethylenediamine;
3-methylheptamethylenediamine;
4,4-dimethylheptamethylenediamine;
2,11-dodecanediamine;
2,2-dimethylpropylenediamine;
octamethylenediamine;
3-methoxyhexamethylenediamine;
2,5-dimethylhexamethylenediamine;
2,5-dimethylheptamethylenediamine;
3-methylheptamethylenediamine;
5-methylnonamethylenediamine;
1,4-cyclohexanediamine;
1,12-octadecanediamine;
bis(3-aminopropyl)sulfide;
N-methyl-bis(3-aminopropyl)amine;
hexamethylenediamine;
heptamethylenediamine;
nonamethylenediamine;

In addition, mixtures of the above diamines may also be employed.

It should be noted that these diamines are given merely for the purpose of illustration and are not considered to be all inclusive. Other diamines not mentioned will readily be apparent to those skilled in the art.

The tetracarboxylic acid dianhydrides of formula (6) may be derived from, or contain, either an aromatic, acyclic or cyclic aliphatic carbon radical. Therefore, the tetracarboxylic acid dianhydrides of formula (6) may further be defined in that R" is a tetravalent radical derived from, or containing, an aromatic radical containing at least 6 carbon atoms characterized by benzenoid unsaturation, wherein each of the 4 carbonyl groups of the dianydride are attached to a separate carbon atom in the tetravalent radical. The carbonyl groups are in parts and the carbonyl radicals in each pair are attached to adjacent carbon atoms of the R" radical or to carbon atoms in the R" radical at most one carbon atom removed, to provide a 5-membered or 6-membered ring of one of the following formulas:

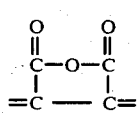  (13)

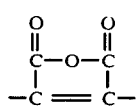  (14)

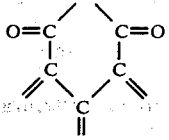  (15)

Illustrative of such tetracarboxylic acid associated with an aromatic carbon radical dianhydrides which are suitable for use in the present invention, along with their commonly known designation in parentheses, are the following:

pyromellitic dianhydride (PMDA);
2,3,6,7-napthalene tetracarboxylic dianhydride;
3,3',4,4'-diphenyl tetracarboxylic acid dianhydride;
1,2,5,6-napthalene tetracarboxylic acid dianhydride;
2,2',3,3'-diphenyl tetracarboxylic acid dianhydride;
2,2-bis(3,4-carboxyphenyl)propane dianhydride;
2,2-bis(4,4'-di[3,4-dicarboxyphenoxy]phenyl)propane dianhydride;
bis(3,4-dicarboxyphenyl) sulfone dianhydride;
benzophenone tetracarboxylic acid dianhydride (BPDA);
perylene-1,2,7,8-tetracarboxylic acid dianhydride;
bis(3,4-dicarboxyphenyl)ether dianhydride, and
bis(3,4-dicarboxyphenyl) methane dianhydride;

Alternately acyclic or cyclic aliphatic anhydrides such, for example, as cyclopentane tetracarboxylic acid dianhydride, cyclohexane tetracarboxylic acid dianhydride, butane tetracarboxylic acid dianhydride, and the like, are also suitable for use in the present invention.

The copolymers materials of this invention are soluble in, or may be diluted by, suitable materials for the application of the material to surfaces of electronic devices. The application of the material to the surface may be bypainting on the material, spraying, dipping and the like. Any means of application may be used which will ensure the complete coverage of the surface to which it is applied. Suitable solvents and diluents are, for example, N-methylpyrrolidone, N-N-dimethylacetamide, N,N-dimethylformamide, tetramethylurea, hexamethylphosphorous triamide, dimethylsulfoxide, and the like.

The copolymer materials of this invention are suitable for use on surfaces of selected, glass, ceramic, organic and inorganic materials and the like. Suitable organic material surfaces are those of such, for example, as thermoplastic materials. Suitable thermoplastic materials are such, for example, as a polyimide, a polyester, a polycarbonate, a polyamide and the like. The novel copolymers of this invention also show excellent bonding to fibrous materials comprising such, for example, as those consisting of glass, boron, quartz, carbon and the like, as well as to cloths embodying the same materials. The novel copolymer materials are also suitable for achieving a good adhesion bond to finely divided materials such, for example, as metals, carbon, quartz, and ceramics such, for example, as alumina, benzelene and the like.

After application of the conformal coating material to the surface area of the body 12, it is cured in situ. A recommended curing cycle is to heat the element and applied coating material slowly to a temperature just below the boiling point of the solvent in the coating. A period of about 30 minutes at this temperature is preferred in order to volatilize the solvent as much as possible without causing the formation of bubbles in the coating material. The temperature may be then increased approximately 50° C to reach a level which is above the boiling point of the solvent. It is held at this higher temperature for about 30 minutes to eliminate substantially all of the solvent and to increase the imidization of the materials of the coating. A further curing step at an elevated temperature about 50° C higher than before for about 30 minutes is followed by an additional curing step practiced at a temperature of about 50° C higher for a sufficient time to complete about a 3 hour curing cycle. This procedure has been found to be sufficient to produce a very desirable conformable coating for the element 10. A typical curing cycle for the copolymers of this invention is about 30 minutes at 150° C ± 10°, about 30 minutes at 200° C ± 10° C, about 30 minutes at 250° C ± 10° C and 300° C ± 10° C for the remainder of a 3 hour curing cycle.

When cured in situ, the conformal coating comprises a polyimide of the structure described heretofore. The layer 34 of cured coating material adheres tenaciously to the silicon surface upon which it is disposed. The cured coating material is impervious to moisture and gases such, for example, as oxygen and nitrogen. The cured material has excellent abrasion resistance properties to protect the element, corona resistance and dielectric strength. The excellent adherence to the surface apparently is responsible for a significant reduction in current leakage on the surface of the body 12 and particularly in the vicinity of the end portions 24 of the P-N junction 22 exposed in the surface of the body 12.

The dielectric strength of the cured material of the layer 34 may be further enhanced by admixing suitable filler materials therein. Preferably, an electrically insulating material having a dielectric constant which is approximately the same as the material of the layer 34 is admixed therein. The filler material is uniformly distributed throughout the coating material as applied. Other materials suitable as a filler material are those materials known to have a relatively good ability to resist electrical conduction although their dielectric constant is higher than that of the material of the layer 34. Suitable electrically insulating filler materials have been found to include aluminum oxide, silicon oxide, glass fibers, boron nitride, quartz, mica, magnesium oxide, activated polytetrafluorethylene, and the like, in a finely divided, or a pulverized form.

With either a filled, or an unfilled siloxane containing polyimide material, the electrical properties of the element 10 are enhanced. The cured coating material of the layer 34 has an inherent elasticity to withstand repeated cycling from dipping in liquid gases in temperature ranges of approximately −100° C to heating in a furnace at approximately 300° C and back into a liquid gas for a temperature excursion range of about 400° C or more. Additionally, I have found the cured materials of the layers 34 to withstand short temperature excursions up to about 400° C to 500° C without degradation of the electrical characteristics of the element 10.

The material of the layer 34 may also be applied over electrically insulating layers of silicon oxide, silicon nitride, aluminum nitride and the like. Referring now to FIG. 2, there is shown an element 50 which is an alternate embodiment of the element 10. All items denoted by the same reference numbers are the same, and function in the same manner, as the corresponding item in FIG. 1.

The element 10 is modified by the deposition of a layer 52 of an electrically insulating material on at least the exposed end portions of the P-N junction 22 and the adjacent surface areas of the body 12. The layer 52 minimizes the current leakage across the exposed end portions. The material of the layer 52 is one selected from the group consisting of silicon oxide, silicon nitride and aluminum nitride. One of more layers 34 of a filled or an unfilled coating material of this invention is disposed over at least the layer 52 to protect the integrity of the electrical properties of the element 50.

The novel siloxane containing polyimides of this invention are also suitable, because of their ease of application and curing, as a protective coating for semiconductor elements embodying a "moat" type isolation groove. Moats or grooves are suitable for use in high power semiconductor elements wherein current leakage which occurs at exposed end portions of P-N junctions must be controlled. As shown with reference to FIG. 3, a high-spaced power transistor 100, the end portions of P-N junction 102 formed by the abutting surfaces of the N-region 104 and the P-region 106 must be protected by a suitable dielectric protective coating.

The protective coating may comprise one or two layers 108 and 110 of suitable material which are the same as, or different from, each other. The material of the layer, 108 and 110 may be any of the materials described heretofore relative to the layer 34 of the elements 10 and 50 of FIGS. 1 and 2 respectively. Additionally, the layer 108 may also comprise one of the electrically insulating materials comprising the layer 52 of the element 50.

Referring now to FIG. 4, the layer 108 of dielectric protective coating material is shown deposited in a moat or groove 114 employed to control leakage across the end portions of the P-N junction 102 exposed therein. Often it is easier to fill the groove by "painting" or by silk-screening and curing in situ.

With reference to FIG. 5, there is shown a portion of a printed circuit board assembly 150. The assembly comprises a board 152 of suitable material such for example as fiberglass, phenolic resin or malamine resin impregnated cloth and the like. A first electrically conductive metal circuit 154 is disposed on a selected portion of the surface 158 of the board 152. A second electrically conductive metal circuit 158 is disposed on another portion of the surface 156 and overlies, in part, a portion of the circuit 154. The material of the circuits 154 and 158 may be of copper, aluminum and the like. A layer 160 of a suitable conformal coating material such, for example, as described with reference to the layer 32 of the elements 10 and 50, described heretofore, is disposed on at least the circuit 154. When cured in situ, the material of the layer 160 shows excellent adherence to the board 152 and the material of the circuit 154. The metal of the layer 158 adheres well to the cured conformal coating material and is electrically isolated thereby from the metal circuit 154.

The following examples are illustrative of the teachings of this invention:

EXAMPLE I

Polyimide Containing 30 Mole Percent Silicone

A mixture of 163 parts by weight of n-methylpyrrolidone, 13.86 g (0.07 Mole) 4,4'-methylenedianiline, 8.28g (0.03 mole) 1,3-bisδ-amino-butyl) tetramethyldisiloxane was charged to a reaction flask flushed with nitrogen. The rea ction was stirred until a homegenous mixture was reasonably assured. To the mixture was then added 32.22 (0.1 mole) benzophenone tetracarboxylic acid dianhydride while the mixture was continually agitated. The agitation was continued until a homogenous viscous fluid was obtained in approximately four hours to assure that the reaction has been completed.

A sample of the fluid was disposed on a surface of a glass slide. Curing was achieved by heating the coated slide for 1/2 hour at 150° C ± 5° followed by 10 minutes at 250° C ± 5° C. The resulting film coating showed excellent adherence to the glass surface and exhibited excellent abrasion resistance when abraded by a spatula.

The coated slide was immersed in boiling water for 8 hours. The coated slide was then removed, cooled to room temperature, and dried. No degradation in adherence or abrasion resistance was observed.

EXAMPLE II

Polyimide Containing 30 Mole Percent Silicone

A polyimide containing 30 mole percent silicone was prepared in the same manner as in Example I and was applied to the junction of a power transistor and leakage was tested for under reverse bias conditions. An unusually low leakage (less than one Nano amp) and a very sharp breakdown voltage was observed.

EXAMPLE III

Polyimide Containing 10 Mole Percent Silicone at 25% Solid Concentration

A slurry containing 2.76 parts of bisγ-(δ-aminobutyl) tetramethyldisiloxane and 17.82 parts methylenedianiline in 159 parts by weight of n-methylpyrrolidone was maintained under a nitrogen atmosphere and a temperature of rom 0° to 5° C by an ice bath. Vigorous stirring was maintained and 32.2 parts benzophenone tetracarboxylic dianhydride was added. The mixture was stirred virorously for an additional two hours after the addition. The ice bath was removed and the reaction was allowed to continue, being vigorously stirred overnight (8 hours) at ambient temperature. A clear yellow viscous solution was thus obtained.

A cured film showed marginal adhesion to the surface of a glass slide and under boiling water peeled off after a period of three hours.

A sample of the prepared material was coated on an exposed end portion of a P-N junction of a power transistor and tested for surface leakage under reverse bias conditions. The leakage current readings were of the order of from 200 to 300 Nano amps and the results contrasted sharply to those coated with material containing 30 mole percent silicone diamines. The material of this example was not acceptable for semiconductor applications.

EXAMPLE IV

Polyimide Containing 45 Mole Percent Silicone

As in Example II the combination of 12.42 parts bis δ-aminobutyl) tetramethyldisiloxane and 10.89 parts of methylenedianiline in 165 parts of N-Methylpyrrolidone with 32.2 parts benzophenone tetracid dianhydride with cooling and stirring produced a viscous deep amper fluid.

A sample of the prepared fluid was coated on an exposed end portion of a P-N junction of a power transistor. The applied material was cured by heating the coated device for ½ hour at 150° C ± 5°, followed by 2 hours at 210° C ± 5° followed by ½ hour at 250° C ± 5°. The leakage current under reverse bias conditions was measured. The leakage current was greater than that measured in the example of Group I but was acceptable.

EXAMPLE V

Polyimide Containing 30 Mole Percent Silicone Derived From Pyromelitic Dianhydride The procedure of Example I was followed in that to a slurry consisting of 7.44 parbis (γaminopropyl) tetramethyldisiloxane, 7.56 parts m-Phyenylene diamine and III parts N-Methylpyrrolidone under $N_2$ and vigorously stirred with cooling in an ice bath was added 21.8 parts pyromelitic anhydride. Upon complete solution, the ice bath was removed and the clear viscous solution stirred for an additional 6 hours.

A sample of the prepared solution was applied as a coating on an exposed portion of a P-N junction of a power transistor and tested for leakage current u nder reverse bias conditions. Readings obtained were of the order of 5 Nano amps, again illustrating excellent electrical properties of such coating materials. Excellent adhesion, abrasion resistance to the 8 hour boiling water tests were achieved.

Standard test samples were prepared for each of the above copolymers of the Examples and subjected to standard corona testing as mentioned by the industry.

The prior art copolymers of silicone free polyimides failed after approximately 50 hours average testing time for the samples of the conformal coating material submitted for testing. This indicated that the prior art material was equivalent to mylar for corona resistance.

The conformal coating materials of this invention were found to be approximately 40 to about 60 times better than mylar when tested for corona resistance.

What I claim is:

1. A reaction product of a tetracarboxylic acid dianhydride, an organic diamine and a di(aminoalkyl) polysiloxane which is a copolymer having recurring structural units of a block copolymer of the formulas :

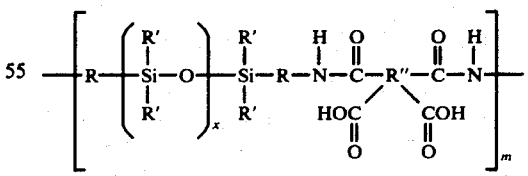

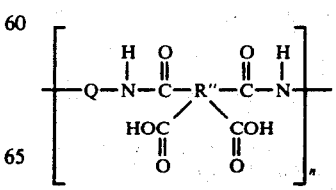

and a random polymer of the formula:

-continued

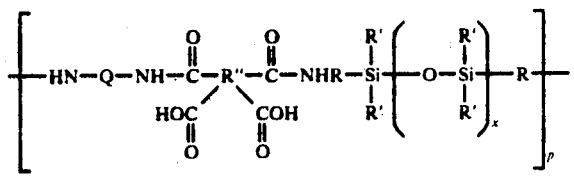

wherein:
R is a divalent hydrocarbon radical;
R' is a monovalent hydrocarbon radical;
R" is a tetravalent organic radical;
Q is a divalent organic radical which is a residue of an organic diamine
$x$ is an integer having a value of from 1 to 10;
$m$ is an integer greater than 1, and
$n$ is an integer greater than 1.
$p$ is an integer greater than or equal to 0.

and the recurring units designated by $m$, $n$, and $p$ are such that the mole percent of silicone diamine in the total polymer constitutes 18 to 45 mole percent of the total diamines in the copolymer.

2. The copolymer of claim 1 wherein each monovalent hydrocarbon radical is the same.

3. The copolymer of claim 1 wherein at least two of the monovalent hydrocarbon radicals are different from each other.

4. The copolymer of claim 1 wherein the recurring units designated by $m$, $n$, and $p$ are such that the mole percent of silicone diamine in the total polymer constitutes 28–32 mole percent of the total diamines in the copolymer.

5. The copolymer of claim 1 wherein the recurring units designated by $m$, $n$, and $p$ are such that the total mole percent of silicone diamine in the total polymer constitutes 30 mole percent of the total diamines in the copolymer.

* * * * *